(12) United States Patent
Chikyo et al.

(10) Patent No.: US 6,723,164 B1
(45) Date of Patent: Apr. 20, 2004

(54) METHOD FOR STABILIZING OXIDE-SEMICONDUCTOR INTERFACE BY USING GROUP 5 ELEMENT AND STABILIZED SEMICONDUCTOR

(75) Inventors: Toyohiro Chikyo, Ibaraki (JP); Mamoru Yoshimoto, Ibaraki (JP)

(73) Assignees: Japan Science and Technology Corporation, Saitama (JP); National Institute for Materials Science, Ibaraki (JP)

( * ) Notice: Subject to any disclaimer, the term of this patent is extended or adjusted under 35 U.S.C. 154(b) by 0 days.

(21) Appl. No.: 10/129,983

(22) PCT Filed: Nov. 10, 2000

(86) PCT No.: PCT/JP00/07940

§ 371 (c)(1), (2), (4) Date: Sep. 24, 2002

(87) PCT Pub. No.: WO01/37330

PCT Pub. Date: May 25, 2001

(30) Foreign Application Priority Data

Nov. 12, 1999 (JP) .......................................... 11-322227

(51) Int. Cl.$^7$ ............................................... C30B 25/18
(52) U.S. Cl. .......................... 117/90; 117/95; 117/106; 117/88

(58) Field of Search ............................... 117/88, 90, 95, 117/106

(56) References Cited

U.S. PATENT DOCUMENTS

| 5,920,775 A | * | 7/1999 | Koh ............................ 438/241 |
| 6,087,208 A | * | 7/2000 | Krivokapic et al. ......... 438/183 |
| 2003/0015704 A1 | * | 1/2003 | Curless ......................... 257/69 |

FOREIGN PATENT DOCUMENTS

| JP | 6-14050 | 5/1994 |
| JP | 10-231196 | 9/1998 |
| JP | 2000-160342 | 6/2000 |
| JP | 2000-183295 | 6/2000 |

* cited by examiner

Primary Examiner—Nadine G. Norton
Assistant Examiner—Matthew A. Anderson
(74) Attorney, Agent, or Firm—Wenderoth, Lind & Ponack, LLP

(57) ABSTRACT

The present invention provides a method for stabilizing an oxide-semiconductor interface, which is free from the formation of an interface layer (reactive layer) between a semiconductor and an interface oxide and which thereby allows satisfactory exhibition of performance capabilities of a functional oxide and achievement of the stability of oxide-semiconductor interface, yet independent of temperature; it also provides a stabilized semiconductor.

3 Claims, 6 Drawing Sheets

(A)

(B)

(A)

(B)

METHOD FOR STABILIZING OXIDE-SEMICONDUCTOR INTERFACE BY USING GROUP 5 ELEMENT AND STABILIZED SEMICONDUCTOR

TECHNICAL FIELD

The present invention relates to a method for stabilizing an oxide-semiconductor interface by using a Group Vb element and to a stabilized semiconductor. In further detail, the invention of the present application provides a method for stabilizing an oxide-semiconductor interface and a stabilized semiconductor, which are useful in highly integrated circuits, ferroelectric materials, ferroelectric memories, etc.

BACKGROUND ART

Extensive research and development have been made heretofore on realizing integrated circuits (referred to sometimes hereinafter as "ICs") with yet higher degree of integration and on realizing ferroelectric ICs. As a means of implementing such ICs with higher integration and ferroelectric ICs, there is established a method comprising forming an oxide film on the surface of a semiconductor such as a silicon to obtain a semiconductor oxide film.

However, the interface between the semiconductor and the oxide film thus formed by a conventional method is extremely unstable, and hence, various reactions were found to occur as to result in unavoidable problems such as an increase in leak current, a malfunction of capacitors, etc.

The problem of such an unstable oxide/semiconductor interface not only concerns the conventionally known electronic components, but also is a severe problem on realizing ferroelectric memories that are attracting much attention as an ultimate memory structure in near future. No solution of overcoming such an unstable oxide/semiconductor interface is found to present, and this has been the obstacle in implementing a ferroelectric memory. Very recently, however, some methods of stabilizing the oxide/semiconductor interface are being proposed to solve the problem of unstable oxide/semiconductor interface.

Such proposals include, for instance, as shown in FIG. 3, a method for stabilizing the oxide/semiconductor interface, which comprises interposing a stable interface oxide (50) such as $Y_2O_3$, MgO, $BiSiO_3$, etc., between a functional oxide (1) such as $BaTiO_3$ or $SrTiO_3$, etc., and the semiconductor (2) such as a Si substrate.

However, in the case of a known method for stabilizing the oxide/semiconductor interface as shown in FIG. 3, an interface layer (a reaction layer) (51), although being thin, was found to be formed between the semiconductor (2) and the interface oxide (50), which unavoidably resulted in a semiconductor with impaired function.

Furthermore, since two types of oxides, namely, the functional oxide (1) and the interface oxide (50), are laminated, there was found another severe problem of causing insufficient exhibition of the intrinsic performance of the functional oxide (1).

Considering the stabilization behavior of the oxide/semiconductor interface in atomic level, the stabilization is realized by the bonding that is formed between the elements constituting the interface oxide (50) and the dangling bonds of the elements constituting the semiconductor (2). For instance, FIG. 4(A) shows schematically a part of the structure of a clean (001) surface of semiconductor Si that is highly reactive, because the outermost surface of the semiconductor Si consists of Si dimers having dangling bonds that are filled with two electrons and those having no electrons. Hence, an interface layer is formed between the semiconductor and the interface oxide as a result.

Furthermore referring to FIG. 4(B), on considering the bonding between the Si dimers (53) in the outermost layer and the Si atoms (52) in the lower layers in the atomic level, it can be understood that the bond is highly stressed by the strain applied thereto. Thus, if seen in atomic level, the bonding between the Si dimers (53) in the outermost layer and the Si atoms (52) in the lower layers easily causes breakage at low temperatures. Hence, theoretically, the oxide/semiconductor interface can be stabilized at super low temperatures. In practice, however, the stabilization of the oxide/semiconductor interface was found to be extremely difficult.

Conclusively, no methods capable of stabilizing the oxide/semiconductor interface independent to temperature while sufficiently exhibiting the performance of the functional oxide without allowing the formation of an interface layer (reaction layer) between a semiconductor and the interface oxide, nor a stabilized semiconductor, are realized to present.

In the light of the aforementioned circumstances, an object of the invention of the present application is to provide a method of stabilizing the oxide/semiconductor interface independent to temperature, which yet sufficiently realizes the performance of the functional oxide without forming an interface layer (reaction layer) between a semiconductor and the interface oxide, and to provide a stabilized semiconductor.

DISCLOSURE OF INVENTION

As a means of overcoming the aforementioned problems, the invention of the present application provides, in a first aspect, a method of stabilizing an oxide-semiconductor interface by using a Group Vb element, which comprises supplying an elemental Group Vb element or two or more types of Group VB element to the surface of a semiconductor and growing an oxide on said Group Vb element, thereby stabilizing the interface between the oxide and the semiconductor.

Furthermore, the invention of the present application provides, in a second aspect, a method of stabilizing an oxide-semiconductor interface by using a Group Vb element, wherein the semiconductor is silicon, the Group Vb element is As, and the oxide grown on the Group Vb element is a functional oxide such as $CeO_2$, $BaTiO_3$, $PbZrTiO_3$, or $SrTiO_3$.

Additionally, the invention of the present application provides, in a third aspect, a stabilized semiconductor the oxide-semiconductor interface thereof is stabilized by using a Group Vb element, in which the interface between the oxide and the semiconductor is stabilized by an oxide being grown on the surface of the semiconductor with an elemental Group Vb element or two or more types of Group Vb element being incorporated between them.

That is, the inventors of the present application extensively conducted studies, and, as a result, they have found that, by terminating the surface of the semiconductor with a Group Vb element, a surface structure having extremely low reactivity can be formed at the interface between the oxide and the semiconductor. The present invention has been accomplished based on these findings.

BEST MODE FOR CARRYING OUT THE INVENTION

Figure 1:
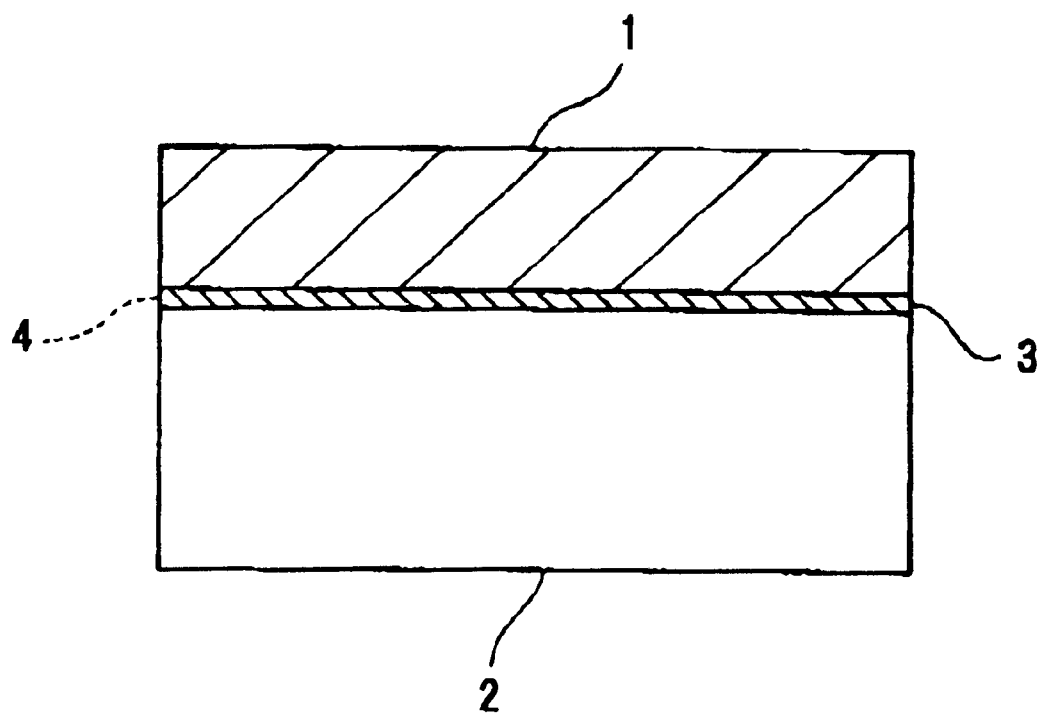
FIG. 1 is a schematically drawn cross section showing an example of a semiconductor formed by a method according to the invention of the present application.

An embodiment of a novel method of stabilizing an oxide-semiconductor interface and a novel type of stabilized semiconductor according to the invention of the present application are shown, for instance, in FIG. 1. More specifically, a Group Vb element is supplied to the surface of a semiconductor (2) to cover the surface of the semiconductor with a coating layer (3) containing the Group Vb element, and a functional oxide (1) is grown thereon to stabilize an interface (4) between the oxide and the semiconductor.

In the present invention, the method for supplying the Group Vb element to the surface of the semiconductor (5) is not particularly limited; for instance, a molecular beam of the Group Vb element may be supplied to the surface of the semiconductor after cleaning the surface by heating the semiconductor substrate in ultra-high vacuum, so that dimers of the Group Vb element may constitute the surface.

In the present invention, any semiconductor (1) can be used without any particular limitation, and any type of semiconductors may be employed, e.g., the Group IV elements such as silicon, germanium, etc.; the Group III–VI compounds such as GaAs, InP, etc.; a hetero semiconductor; a piezo semiconductor; etc.

There is no particular limitation on the Group Vb element for use in the present invention, and there may be used elements such as N, P, As, Sb, Bi, etc.

The Group Vb elements enumerated above may be used in the elemental form, but two or more types thereof may be supplied as well.

As a functional oxide (1) to be formed on the coating layer (3) using a Group Vb element in the present invention, there may be grown a dielectric material such as $BaTiO_3$, $SrTiO_3$, $PbZrTiO_3$, etc., or a lattice matching oxide such as $CeO_2$. By using such functional oxides (l), a sharply distinguished oxide-semiconductor interface can be implemented.

The method according to the present invention greatly differs from a conventional one in that the oxide-semiconductor interface is stabilized by covering the surface of the semiconductor with a Group Vb element at a thickness of about 1 atomic layer. Thus, the performance of the functional oxide can be sufficiently exhibited yet without losing its function, because an interface layer (reaction layer) is not formed between the semiconductor and the interface oxide, but a stable oxide-semiconductor interface is established. Furthermore, as is described hereinafter, a stable oxide-semiconductor interface can be formed independent to temperature.

Conclusively, the invention according to the present invention is applicable in stably forming capacitors for use in memories of next generation integrated circuits, which, as a result, enables the implementation of a power-saving high-speed ferroelectric memory device capable of realizing high degree of integration, an application to an ultra-thin oxide film-semiconductor interface having high dielectric constant or a gate oxide film, an oxide-semiconductor superlattice and a high efficiency light-emitting device.

The stability of the oxide-semiconductor interface according to the present invention is described below by referring to its atomic structure.

Figure 2:
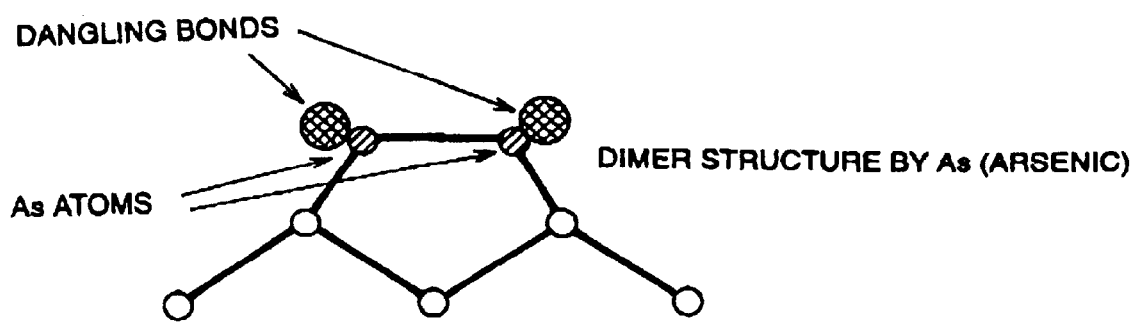
FIGS. 2(A) and 2(B) are each a schematically drawn diagram showing the behavior of atoms in carrying out the method of the invention according to the present application.
Figure 2:
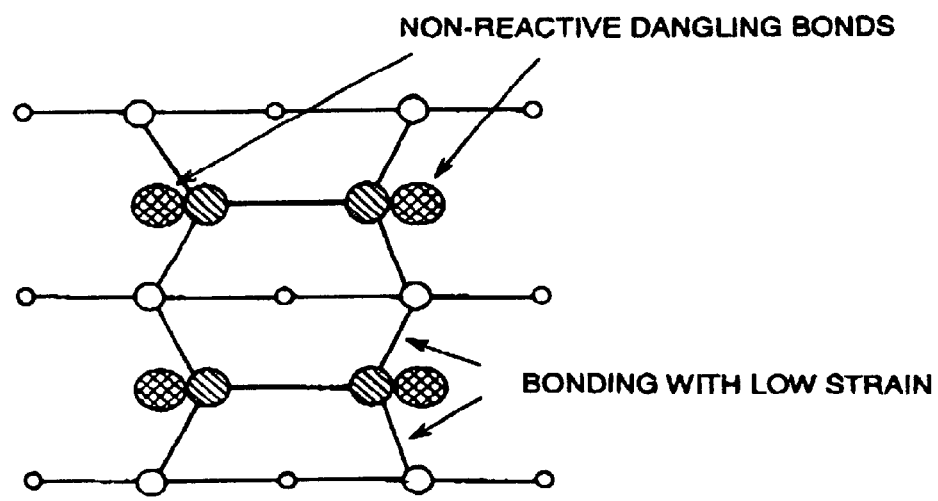
Figure 3:
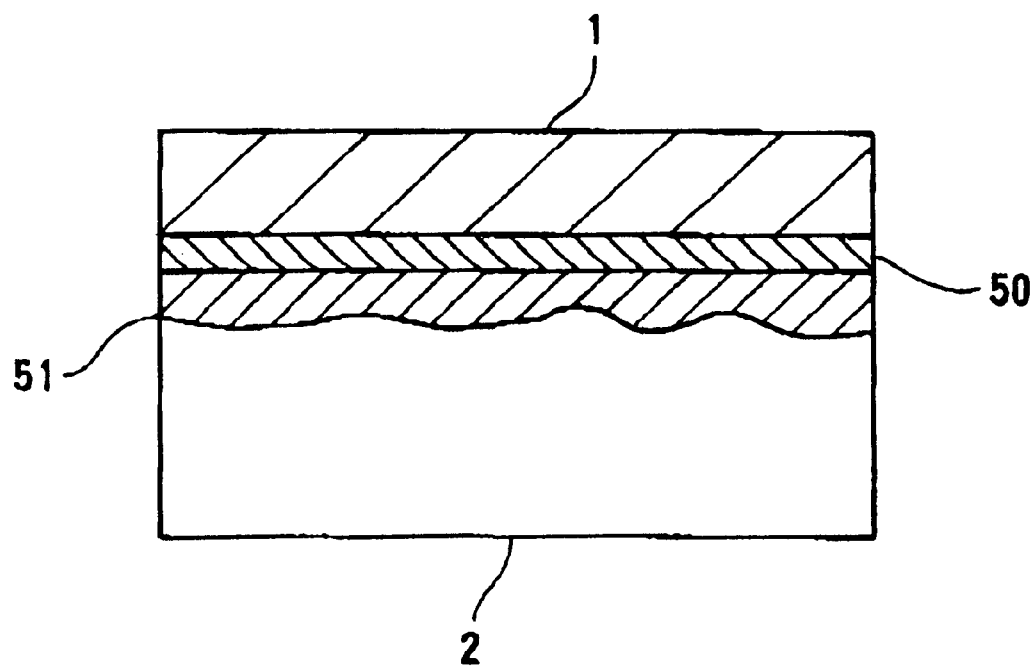
FIG. 3 in a schematically drawn cross section showing a semiconductor formed by a prior art method.
Figure 4:
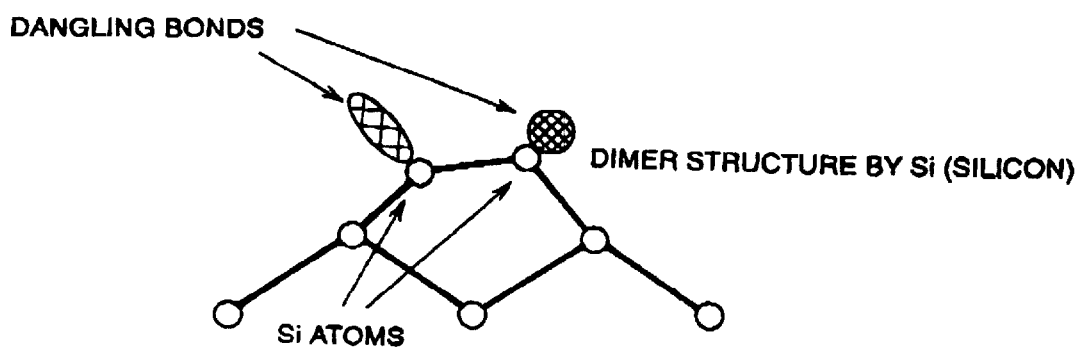
FIGS. 4 (A)and 4(B) are each a schematically drawn diagram showing the behavior of atoms in carrying out a conventional method.
Figure 4:
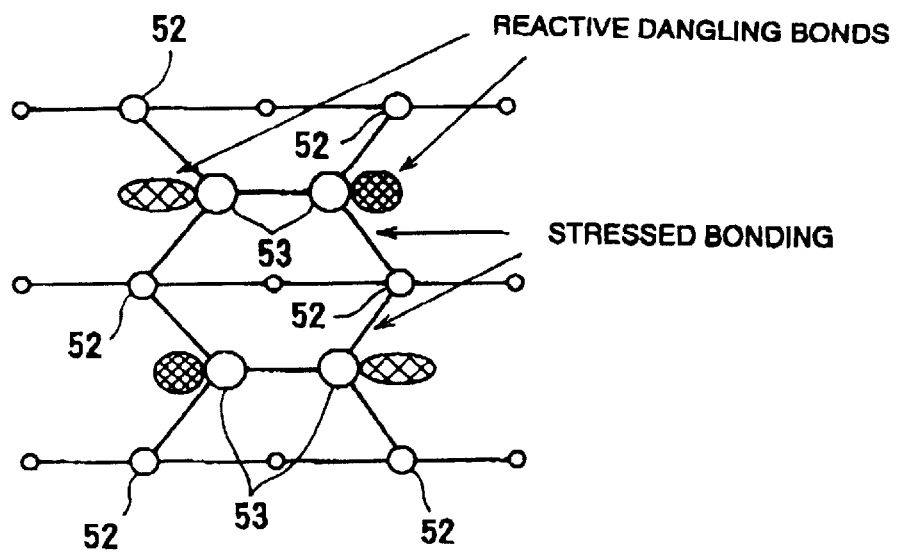

Referring to FIG. 2(A), there is shown a surface structure in atomic scale of a (001) surface of a semiconductor, silicon (Si), covered with a Group Vb element, arsenic (As). Dimers of As constitute the outermost surface of the semiconductor, and the dangling bonds of the dimers are filled with two electrons. Hence, the reactivity of the surface of As is lost. Thus, in the present invention as a result, which is greatly different from the conventional methods of stabilization, no interface layer (reaction layer) is formed between the semiconductor and the interface oxide.

Further referring to FIG. 2(B), the atomic bonding of the As dimers (5) in the outermost layer with the Si atoms (6) in the lower layers is very strong, and this bonding is formed on the surface as a group of four atomic bonds. Hence, the resulting surface exhibits less reactivity. This results in a stabilized oxide-semiconductor interface.

Furthermore, the surface stress can be relaxed by forming an As dimer having a long bonding length. Thus, the bonding between the As dimers and the Si atoms in the lower layer results with less strain, and the bonding is maintained to higher temperatures independent to the temperature. This greatly contributes to the stabilization of an oxide-semiconductor interface.

The present invention is described in further detail below by making reference to Examples.

EXAMPLES

First, a Si (001) substrate, which is used as the semiconductor, was heated in ultrahigh vacuum to form a clean (001) surface. Then, by supplying a Group Vb element in the form of an As molecular beam on the surface of the semiconductor, a 2×1 structure of Si (001): As constructed from dimers of a Group Vb element, i.e., As, was formed on the semiconductor substrate. Then, $CeO_2$ was grown on the thus obtained sample as a functional oxide at a substrate temperature of 300° C. For comparison, $CeO_2$ was grown on a cleaned surface of Si at the same temperature.

Figure 5:
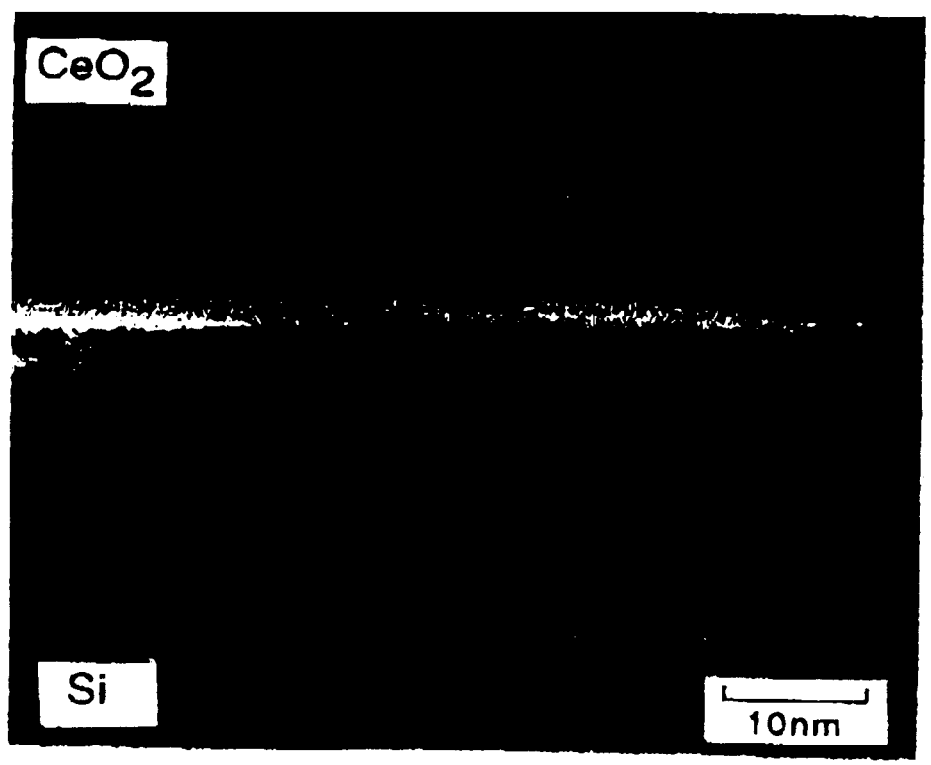
FIG. 5 is a high resolution transmission electron micrograph of a $CeO_2/Si$ interface covered with As; it reads that the continuity of the lattice at the $CeO_2/Si$ interface is obtained, and that an acute interface is formed.
Figure 6:
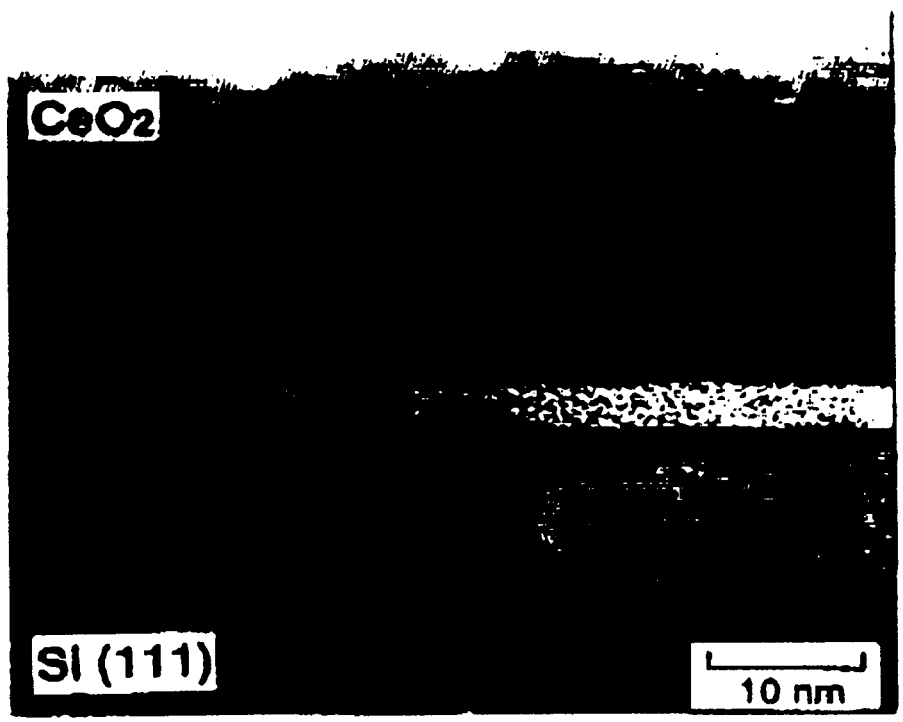
FIG. 6 is a high resolution transmission electron micrograph of a $CeO_2/Si$ interface not covered with As; the formation of about 10 nm thick amorphous interface layer can be observed at the $CeO_2/Si$ interface.

On observing the interface structure between the semiconductor and the functional oxide, as shown in FIG. 5, a continuous lattice was found to be formed on the $CeO_2/Si$ interface to which the Group Vb element As had been supplied; however, as shown in FIG. 6, the formation of about 10 nm thick reaction layer was observed on the $CeO_2/Si$ interface to which no As was supplied as the Group Vb element.

From the results above, the surface treatment of silicon by using a Group Vb element was found to be effective in forming a sharp oxide/silicon interface.

As a matter of course, the present invention is not only limited to the example above, but various modifications can be made on the details.

As described in detail above, the invention according to the present application provides a method for stabilizing an oxide-semiconductor interface, which is free from the formation of an interface layer (reactive layer) between a semiconductor and an interface oxide and which thereby allows satisfactory exhibition of performance capabilities of a functional oxide and achievement of the stability of oxide-semiconductor interface, yet independent of temperature; it also provides a stabilized semiconductor, and a stabilized semiconductor implemented by the above method.

Conclusively, the invention according to the present invention is applicable to the stable formation of capacitors for use in memories of next generation integrated circuits, which, as a result, enables the implementation of a power-saving high-speed ferroelectric memory device capable of high degree of integration, an application to an ultra-thin oxide film-semiconductor interface having high dielectric constant or a gate oxide film, an oxide-semiconductor superlattice, and a high efficiency light-emitting device.

What is claimed is:

1. A method of stabilizing an oxide-semiconductor interface by using a Group Vb element, which comprises supplying an elemental Group Vb element or two or more types of Group Vb element to the surface of a semiconductor and growing an oxide on said Group Vb element, thereby stabilizing the interface between the oxide and the semiconductor.

2. A stabilizing method as claimed in claim 1, wherein the semiconductor is silicon, the Group Vb element is As, and the oxide grown on the Group Vb element is $CeO_2$, $BaTiO_3$, $PbZrTiO_3$, or $SrTiO_3$.

3. A stabilized semiconductor the oxide-semiconductor interface thereof is stabilized by using a Group Vb element, in which the interface between the oxide and the semiconductor is stabilized by an oxide being grown on the surface of the semiconductor with an elemental Group Vb element or two or more types of Group Vb element being incorporated between them.

* * * * *